United States Patent
Lin et al.

(10) Patent No.: US 9,312,149 B2
(45) Date of Patent: Apr. 12, 2016

(54) METHOD FOR FORMING CHIP-ON-WAFER ASSEMBLY

(71) Applicant: Taiwan Semiconductor Manufacturing Company, Ltd., Hsin-Chu (TW)

(72) Inventors: Jing-Cheng Lin, Chu Tung Zhen (TW); Cheng-Lin Huang, Hsin-Chu (TW); Szu Wei Lu, Hsin-Chu (TW); Jui-Pin Hung, Hsin-Chu (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/299,288

(22) Filed: Jun. 9, 2014

(65) Prior Publication Data

US 2014/0287553 A1  Sep. 25, 2014

Related U.S. Application Data

(62) Division of application No. 13/298,126, filed on Nov. 16, 2011, now Pat. No. 8,779,599.

(51) Int. Cl.
| | |
|---|---|
| *H01L 21/00* | (2006.01) |
| *H01L 21/56* | (2006.01) |
| *H01L 23/48* | (2006.01) |
| *H01L 25/065* | (2006.01) |
| *H01L 23/00* | (2006.01) |
| *H01L 23/31* | (2006.01) |
| *H01L 23/16* | (2006.01) |
| *H01L 25/00* | (2006.01) |

(52) U.S. Cl.
CPC ............ *H01L 21/561* (2013.01); *H01L 21/568* (2013.01); *H01L 23/16* (2013.01); *H01L 23/3128* (2013.01); *H01L 23/481* (2013.01); *H01L 23/562* (2013.01); *H01L 24/94* (2013.01); *H01L 24/97* (2013.01); *H01L 25/0652* (2013.01); *H01L 25/50* (2013.01); *H01L 2224/14181* (2013.01); *H01L 2224/16145* (2013.01); *H01L 2224/94* (2013.01); *H01L 2225/06513* (2013.01); *H01L 2225/06541* (2013.01); *H01L 2225/06586* (2013.01); *H01L 2225/06593* (2013.01); *H01L 2924/10253* (2013.01); *H01L 2924/15311* (2013.01); *H01L 2924/181* (2013.01); *H01L 2924/18161* (2013.01)

(58) Field of Classification Search
None
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |

(Continued)

FOREIGN PATENT DOCUMENTS

| | | |
|---|---|---|
| CN | 1400661 | 3/2003 |
| CN | 102169841 | 8/2011 |

(Continued)

*Primary Examiner* — Evan Pert
*Assistant Examiner* — Shaka White
(74) *Attorney, Agent, or Firm* — Slater & Matsil, L.L.P.

(57) ABSTRACT

A device includes a bottom chip and an active top die bonded to the bottom chip. A dummy die is attached to the bottom chip. The dummy die is electrically insulated from the bottom chip.

20 Claims, 6 Drawing Sheets

(56) References Cited

U.S. PATENT DOCUMENTS

| | | |
|---|---|---|
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,858,938 B2 | 2/2005 | Michii |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,969,149 B2 | 11/2005 | Eguchi et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,247,950 B2 | 7/2007 | Fujisawa et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,944,049 B2 | 5/2011 | Fujii |
| 7,973,310 B2 | 7/2011 | Wang et al. |
| 8,080,122 B2 | 12/2011 | Sunohara et al. |
| 8,373,278 B2 | 2/2013 | Shinogi |
| 2004/0026789 A1 | 2/2004 | Michii |
| 2005/0046002 A1* | 3/2005 | Lee et al. ............... 257/678 |
| 2007/0210456 A1 | 9/2007 | Takezawa et al. |
| 2008/0169549 A1 | 7/2008 | Carson |
| 2008/0224322 A1* | 9/2008 | Shinogi ................. 257/777 |
| 2009/0189268 A1 | 7/2009 | Kado et al. |
| 2010/0159643 A1* | 6/2010 | Takahashi et al. ......... 438/108 |
| 2011/0215470 A1 | 9/2011 | Chen et al. |
| 2011/0278732 A1 | 11/2011 | Yu et al. |
| 2011/0316572 A1 | 12/2011 | Rahman |
| 2012/0049366 A1 | 3/2012 | Zeng |
| 2012/0061856 A1 | 3/2012 | Vora |
| 2012/0097944 A1 | 4/2012 | Lin et al. |
| 2012/0181648 A1 | 7/2012 | Andry et al. |
| 2012/0217654 A1 | 8/2012 | Shin et al. |
| 2012/0286814 A1 | 11/2012 | Wang et al. |
| 2014/0124961 A1 | 5/2014 | Wu et al. |

FOREIGN PATENT DOCUMENTS

| | | |
|---|---|---|
| JP | 2010144369 | 8/2010 |
| TW | 201027692 | 7/2010 |

* cited by examiner

METHOD FOR FORMING CHIP-ON-WAFER ASSEMBLY

This application is a divisional of U.S. patent application Ser. No. 13/298,126, entitled "Method for Forming Chip-on-Wafer Assembly," filed on Nov. 16, 2011, which application is incorporated herein by reference.

BACKGROUND

In the formation of three-dimensional integrated circuits, dies are often bonded on semiconductor wafers. The bonding process typically include selecting known-good-dies (top dies), and bonding the top dies to the bottom chips in a bottom wafer using flip chip bonding. Each of the bottom chips may be bonded to one or more top die. After the bonding, underfill is dispensed into the space between the top dies and the bottom chips, and a molding compound is molded onto the top dies and the bottom wafer. After the molding of the molding compound, the package may have a warpage due to the contraction of the molding compound. Accordingly, stresses may be generated and applied to the bottom wafer and the overlying top dies.

The situation is further worsened after the backside grinding process, during which the silicon substrate in the bottom wafer is grinded, and hence the thickness of the bottom wafer is significantly reduced. The warpage is accordingly more severe. The warpage may cause poor adhesion between the layers in the resulting package, poor resistance to moisture, bump cracking, and the like. As a result, reliability issues are more likely to occur, which reliability issues may be identified in thermal cycle tests, drop tests, bend tests, and the like.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 6 are cross-sectional views of intermediate stages in the manufacturing of a package in accordance with various embodiments, wherein dummy dies are attached to bottom chips in a wafer.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure and the method of forming the same are provided in accordance with various embodiments. The intermediate stages of forming the package structure are illustrated. The variations of the embodiments are discussed. Throughout the various views and illustrative embodiments, like reference numbers are used to designate like elements.

Figure 1A:
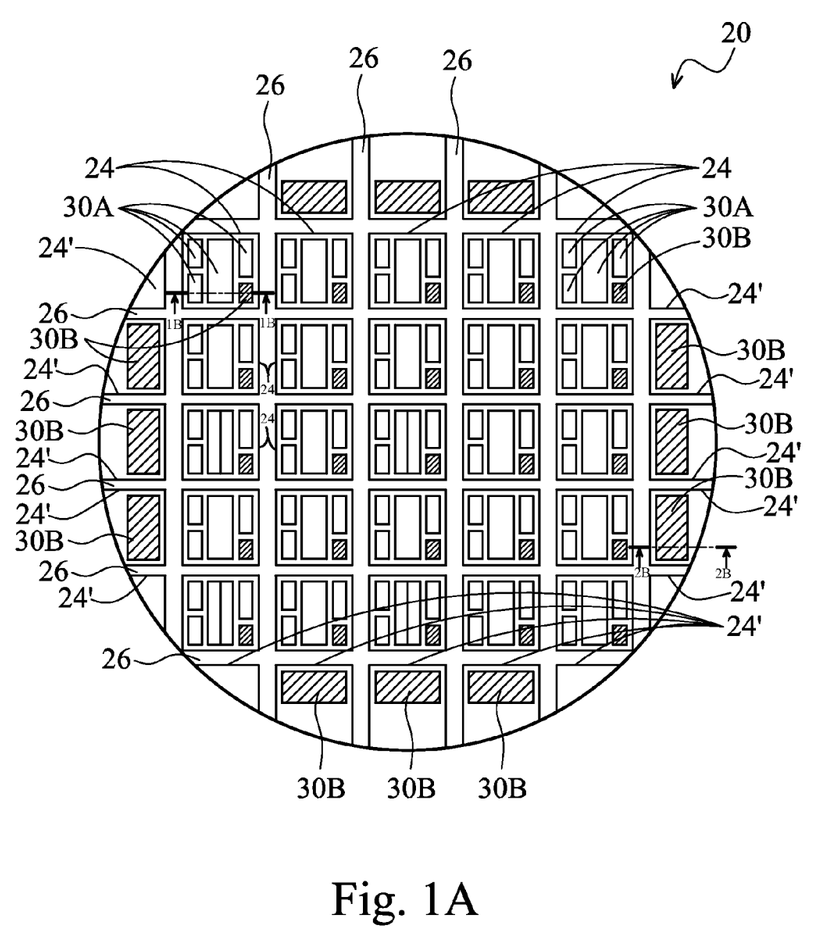

FIG. 1A illustrates a top view of bottom wafer 20. In an embodiment, bottom wafer 20 is a device wafer including semiconductor substrate 38 (not shown in FIG. 1A, please refer to FIG. 1B), and active devices such as transistors (not shown) formed at the surface of semiconductor substrate 38. Semiconductor substrate 38 may be a silicon substrate, or may be formed of other semiconductor materials. Bottom wafer 20 includes a plurality of identical bottom chips 24 therein, wherein bottom chips 24 may be identical to each other. Scribe lines 26 separate bottom chips 24 from each other. A plurality of top dies 30, including active top dies 30A and dummy dies 30B, are bonded to bottom chips 24. Throughout the description, the terms "active die" and "active top die" refer to the die or chip that has electrical functions that contribute to the electrical operation of the resulting package, while the term "dummy die" refers to the die or chip that does not have any electrical function, and the dummy die does not contribute to the electrical operation of the resulting package. Active top dies 30 may be device dies, or may be packages that including device dies bonded to other package components such as a package substrate, an interposer, and the like.

Figure 1B:
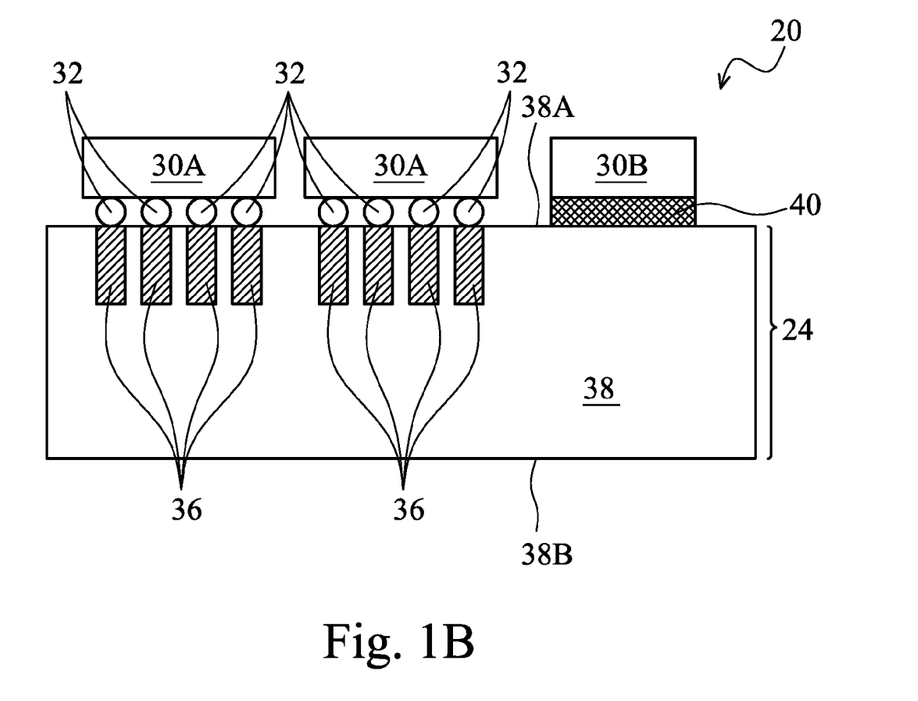

FIG. 1B illustrates a cross-sectional view of the structure shown in FIG. 1A, wherein the cross-sectional view is taken along a plane crossing line 1B-1B in FIG. 1A. Bottom chips 24 may be active chips that include active devices, contact plugs, metal lines, vias and the like (which are formed over top surface 38A of substrate 38), although they are not shown in FIG. 1B. As shown in FIG. 1B, bottom chip 24 may be bonded with one or a plurality of active top dies 30A. Electrical connectors 32 bond active top dies 30A to bottom die 24. Electrical connectors 32 may be solder bumps, metal-to-metal bonds, solder bumps bonded to metal posts, or the like, and may be used for conducting electrical signals between bottom chip 24 and active top dies 30A. Accordingly, the integrated circuit devices such as transistors (not shown) in active top dies 30A are electrically coupled to the devices in bottom chip 24. In an embodiment, electrical connectors 32 are electrically coupled to through-substrate vias (TSVs, also sometimes known as through-silicon vias) 36 in semiconductor substrate 38. TSVs 36 extend from top surface 38A of substrate 38 to an intermediate level between top surface 38A and bottom surface 38B of substrate 38.

Dummy die 30B is attached to bottom die 24, for example, through die-attach film 40, which may be a polymer-based glue. Alternatively, die-attach film 40 may be a thermal-plastic film that can be cured when heated. In some embodiments, die-attach film 40 may be an adhesive that loses it adhesion when exposed under light. Dummy die 30B may be a blank die, for example, a semiconductor die (such as a silicon die) that does not have active integrated circuit devices such as transistors and/or passive devices such as resistors, capacitors, and/or the like, formed therein. Dummy die 30B may also be free from low-k dielectric layers, metal lines, vias, and/or the like, therein. In other embodiments, dummy die 30B may be a dielectric die. In yet other embodiments, dummy die 30B may reuse bad dies that failed in tests, and hence may include integrated circuit devices such as transistors therein. However, the integrated circuit devices in dummy die 30B, if any, do not perform any electrical function in the operation of the resulting package 60 (FIG. 5), and are not supplied with power.

Die-attach film 40 may be formed of an electrical insulating material, and may electrically insulate dummy die 30B from bottom chip 24. Although FIG. 1A illustrates a single dummy die 30B bonded to one bottom chip 24, in alternative embodiments, a plurality of dummy dies 30B may be attached to the same bottom chip 24.

Referring back to FIG. 1A, some of dummy dies 30B are attached to bottom chips 24, which bottom chips 24 are complete chips having a rectangular shape, and are functional chips. Additional dummy dies 30B may also be attached to incomplete bottom chips 24'. Incomplete bottom chips 24' are located at the edges of wafer 20, and do not have rectangular shapes. Incomplete bottom chips 24' will not be packaged as products for use. Accordingly, no active top dies 30A are bonded to incomplete bottom chips 24'.

Figure 2A:
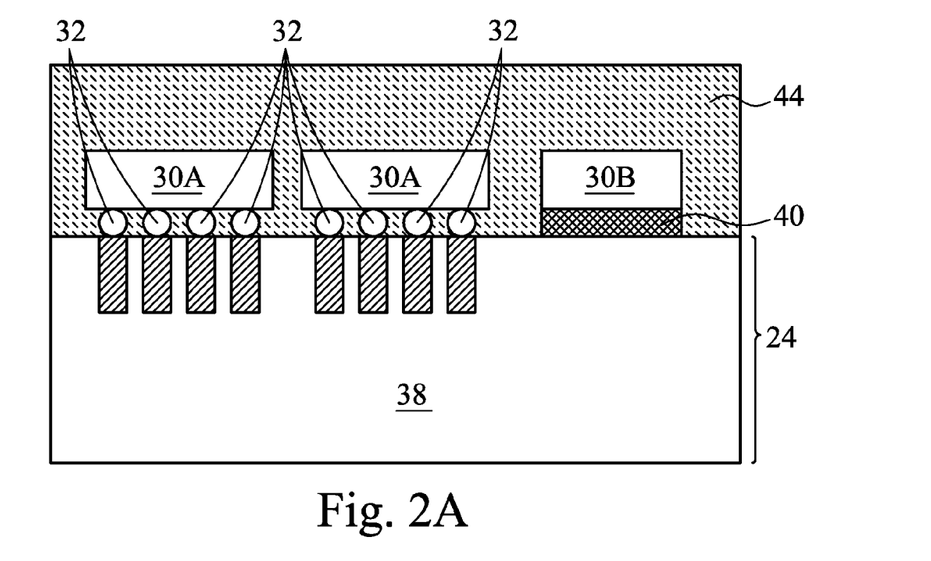
Figure 2B:
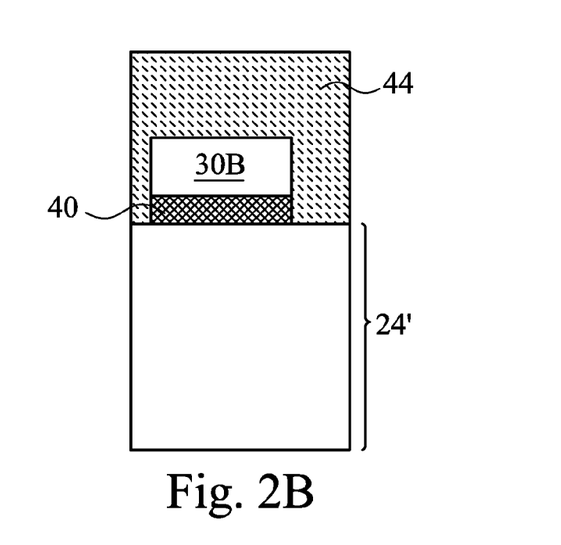

FIGS. 2A and 2B illustrate the molding process. Molding compound 44 is filled into the gaps between active top dies 30A and dummy dies 30B. Molding compound 44 may have a top surface higher than the top surfaces of active top dies 30A and dummy dies 30B. A curing process is then performed to cure molding compound 44.

FIG. 2A illustrates a cross-sectional view obtained from the same plane that crosses line 1B-1B in FIG. 1A. As shown in FIG. 2A, molding compound 44 is in physical contact with active top dies 30A, dummy die 30B, die-attach film 40, and bottom chip 24. FIG. 2B illustrates a cross-sectional view of incomplete bottom chips 24', wherein the cross-sectional view is obtained from the same plane that crosses line 2B-2B in FIG. 1A. As shown in FIG. 2B, die-attach film 40 attaches dummy die 30B to incomplete die 24', and molding compound 44 may be in physical contact with die-attach film 40, dummy die 30B, and incomplete die 24'.

Figure 3:
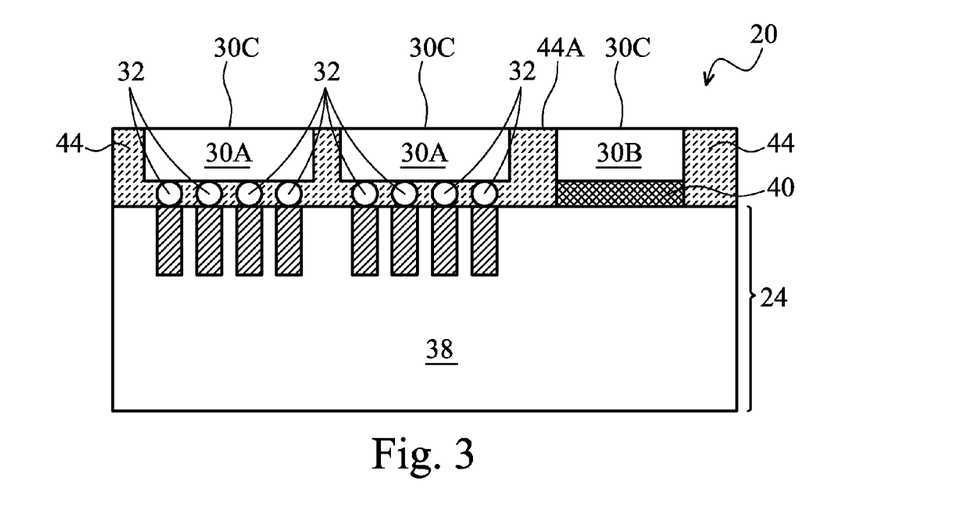

Next, as shown in FIG. 3, a planarization, such as a grinding, is performed to remove excess molding compound 44, so that top surface 44A of molding compound 44 is flat. In an embodiment, the planarization is performed until top surfaces 30C of active top dies 30A and dummy dies 30B are exposed.

In the illustrated embodiments in FIG. 1A, active top dies 30A that are bonded to a same bottom chip 24 have a total top-view area smaller than the top-view area of bottom chip 24. Furthermore, a significant portion of the chip area of bottom chip 24 is not covered by active top dies 30A. This results in large gaps to be formed between active top dies 30A, and hence in the structure as shown in FIG. 3, if dummy 30B does not exist, molding compound 44 would have a high pattern density, especially in the chip areas that include the large gaps. On the other hand, in some other chip areas that include active top dies 30A, the pattern density of molding compound 44 is low. By inserting dummy dies 30B, the pattern density of molding compound 44 throughout wafer 20 is more uniform. This may help reduce the warpage of the resulting package (for example, the structure shown in FIG. 35), which includes bottom wafer 20, top dies 30, and molding compound 44.

Figure 4:
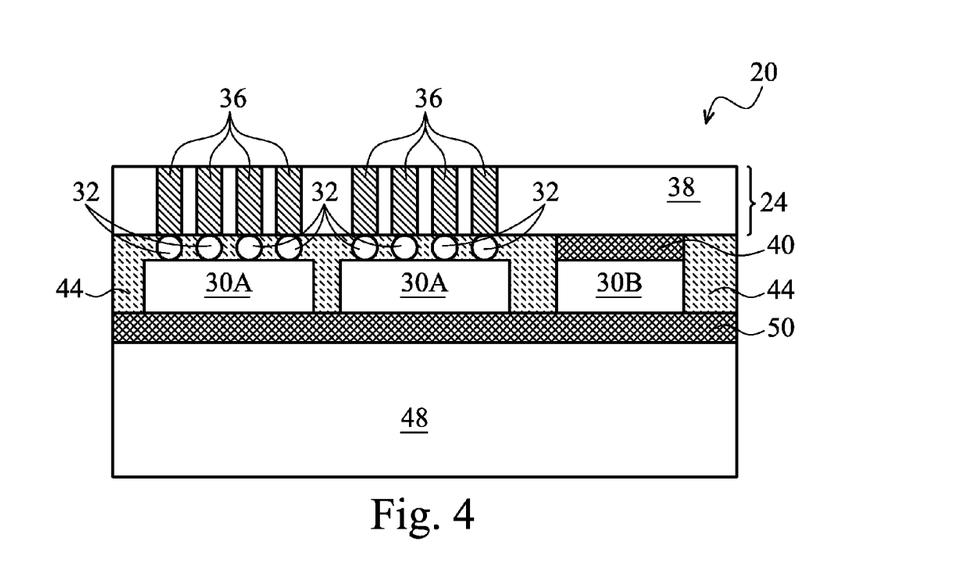

Referring to FIG. 4, the package structure shown in FIG. 3 is flipped upside down. Molding compound 44 and top dies 30 are attached (bonded) to carrier 48, for example, through adhesive 50. In an embodiment, adhesive 50 is a light-to-debond film, which loses adhesion when exposed to light. For example, adhesive 50 may be a ultra-violet (UV) glue. Adhesive 50 may also be a thermal-to-debond film, which loses adhesion when heated. Adhesive 50 may also be formed of essentially a same material as the material of die-attach film 40. In an exemplary formation process, a backside grinding is performed to grind substrate 38, until TSVs 36 are exposed.

Figure 5:
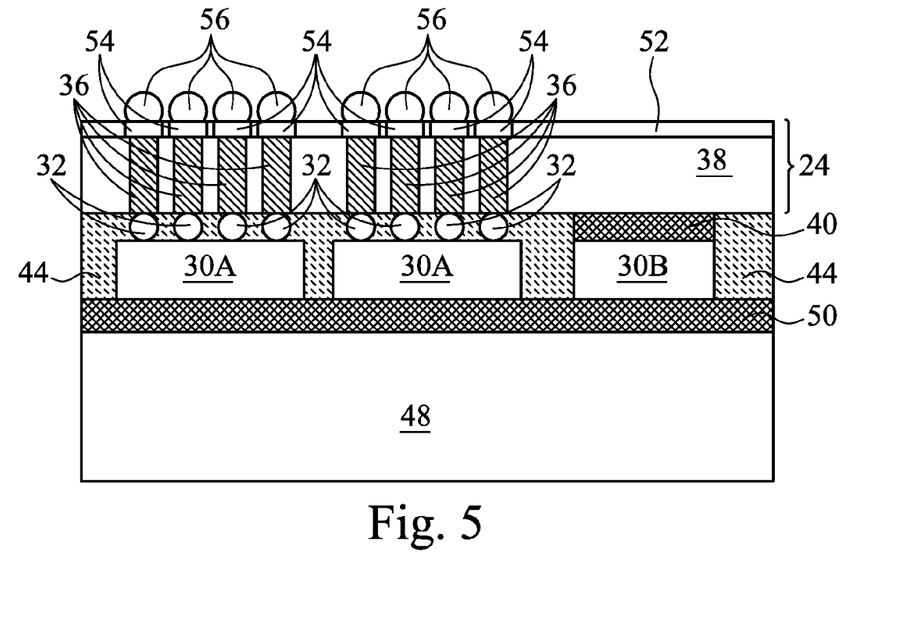

Referring to FIG. 5, a backside interconnect structure of bottom chip 24 (and bottom wafer 20) is formed. In an exemplary embodiment, the backside interconnect structure includes dielectric layer(s) 52, and bond pads/redistribution lines 54. Bond pads/redistribution lines 54 are electrically coupled to TSVs 36. Next, connectors 56 may be placed or formed on bond pads 54. In some embodiments, connectors 56 are solder balls or solder bumps, and are placed/formed and reflowed. In alternative embodiments, connectors 56 may include metal-to-metal bonds, solder bumps bonded to metal posts, or the like, and may be used for conducting electrical signals between bottom chip 24 and another package component such as a device die, an interposer, a package substrate, or a printed circuit board (PCB).

Figure 6:
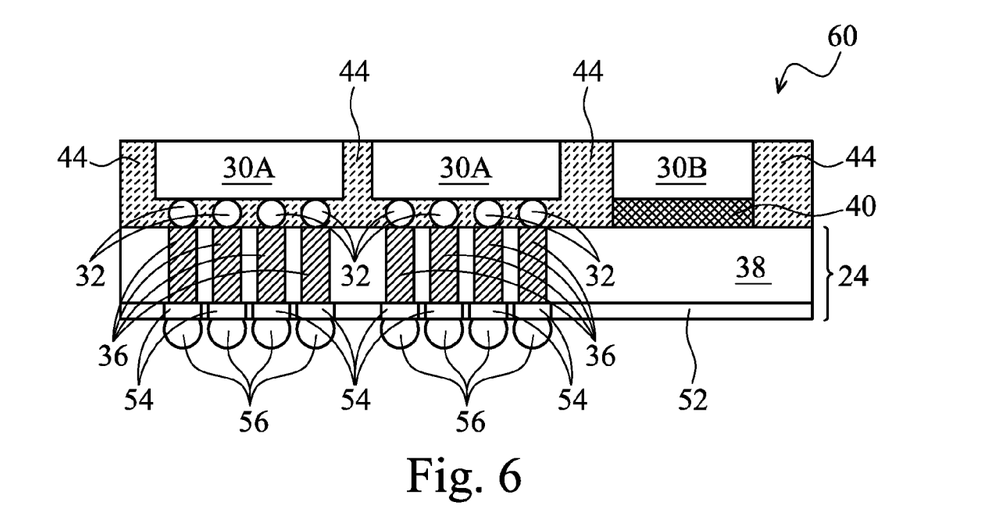

Next, as shown in FIG. 6, carrier 48 is detached (debonded) from wafer 20, for example, by exposing adhesive 50 as in FIG. 4 to a light, so that adhesive 50 and carrier 48 can be removed. A die saw step may then be performed to saw wafer 20 apart to form a plurality of packages 60, wherein one of the plurality of packages 60 is shown in FIG. 6. In the resulting package 60, dummy die 30B remains, and is not removed after the subsequent packaging processes such as the bonding of package 60 to a package substrate, an interposer, a printed circuit board (PCB), and the like. In addition, at the time package 60 is used and supplied with power, dummy die 30B still remains.

Figure 7:
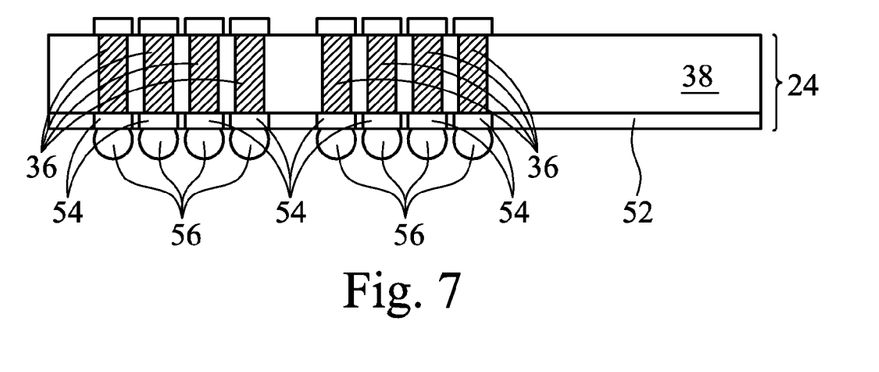
FIGS. 7 and 8 illustrate cross-sectional views of intermediate stages in the manufacturing of a package in accordance with various alternative embodiments, wherein a dummy die is attached to discrete bottom chip.
Figure 8:
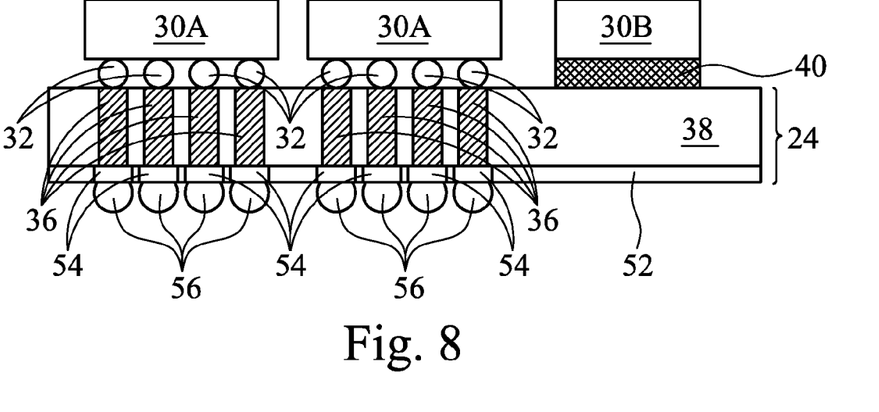

FIGS. 7 and 8 illustrate the cross-sectional views of intermediate stages in the forming of a package structure in accordance with alternative embodiments. Unless specified otherwise, the reference numerals in these embodiments represent like elements in the embodiments illustrated in FIGS. 1 through 6. Referring to FIG. 7, bottom chip 24 is provided. It is noted that bottom chip 24 may include the active devices, contact plugs, metal lines, vias and the like, although they are not shown in FIG. 7. In some embodiments, bottom chip 24 has already been sawed from the respective wafer, and hence is also referred to as bottom die 24 hereinafter. In alternative embodiments, bottom chip 24 is a part of a wafer that has not been sawed apart. The wafer may include a plurality of chips substantially identical to the illustrated bottom chip 24. Backside interconnect structure including dielectric layer(s) 52 and metal lines/pads 54 are formed on the backside of bottom die 24. Connectors 56 may optionally be formed on the backside interconnect structure, and electrically coupled to TSVs 36 and the devices such as transistors in bottom die 24.

In FIG. 8, active top dies 30A are bonded to bottom die 24, and dummy die(s) 30B is attached to bottom die 24. The bonding method and the attachment method, and the respective materials may be essentially the same as in FIG. 1B, and hence are not repeated herein. Next, molding compound 44 is applied, cured, and optionally grinded. The resulting structure may be essentially the same as shown in FIG. 6. In the embodiments that bottom chip 24 in FIGS. 7 and 8 is a part of wafer, a die-saw step may be performed to saw apart the wafer, so that the chips similar to what is shown in FIG. 8 are separated from each other, with each of the chips having the structure as in FIG. 8.

In the embodiments, by attaching dummy dies to wafers or bottom dies, the pattern density of the molding compound may be more uniform, and hence the warpage in the resulting package may be reduced. The reduction in the warpage results in the reduction in the delamination between different layers in the resulting package. As a result, the molding compound has better resistance to moisture penetration. The reliability of the package is thus improved. The usage of the dummy dies results in less molding compound to be used in the resulting packaging, and hence the out-gassing from the molding compound is reduced.

In accordance with embodiments, a device includes a bottom chip and an active top die bonded to the bottom chip. A dummy die is attached to the bottom chip. The dummy die is electrically insulated from the bottom chip.

In accordance with other embodiments, a device includes a bottom wafer that includes a plurality of identical chips. A plurality of active top dies is bonded to the bottom wafer, wherein each of the plurality of active top dies is bonded to one of the plurality of identical chips through electrical connectors. A plurality of dummy dies is attached to the bottom chips, wherein each of the plurality of dummy dies is attached to one of the plurality of identical chips. The device further includes a plurality of die-attach films, wherein each of the plurality of die-attach films adheres one of the plurality of dummy dies to one of the plurality of identical chips.

In accordance with yet other embodiments, a method includes bonding a plurality of active top dies to a bottom wafer. Each of the plurality of active top dies is bonded to one of a plurality of identical chips in the bottom wafer through electrical connectors. A plurality of dummy dies is attached to the plurality of identical chips. Each of the plurality of dummy dies is attached to one of the plurality of identical chips through one of a plurality of die-attach films. The plurality of dummy dies is electrically insulated from the plurality of identical chips by the plurality of die-attach films. A molding compound is filled into the gaps between the plurality of active top dies and the plurality of dummy dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   bonding a plurality of active dies to a wafer, wherein each of the plurality of active dies is bonded to one of a plurality of chips in the wafer through electrical connectors;
   attaching a plurality of dummy dies to the plurality of chips, wherein each of the plurality of dummy dies is attached to one of the plurality of chips through one of a plurality of die-attach films, with each of the plurality of die-attach films in physical contact with both a respective one of the dummy dies and a respective one of the plurality of chips, and the plurality of dummy dies is electrically insulated from the plurality of chips by the plurality of die-attach films; and
   filling a molding compound into gaps between the plurality of active dies and the plurality of dummy dies.

2. The method of claim 1, wherein after the filling the molding compound, the plurality of active dies and the plurality of dummy dies are molded in the molding compound.

3. The method of claim 1 further comprising:
   after the filling the molding compound, attaching a carrier to the wafer;
   performing a backside grinding to a substrate in the wafer to expose a through-via in the wafer; and
   forming a backside interconnect structure on a backside of the wafer to electrically couple to the through-via; and sawing the wafer to form a plurality of packages, wherein each of the plurality of packages comprises one of the plurality of active dies and one of the plurality of dummy dies.

4. The method of claim 1, wherein no electrical connector electrically couples any of the plurality of dummy dies to any of the plurality of chips.

5. The method of claim 1, wherein the plurality of dummy dies comprises blank dies free from integrated circuits therein.

6. The method of claim 1, wherein the plurality of dummy dies comprises silicon dies free from low-k dielectric layers, metal lines, and vias therein.

7. The method of claim 1, wherein the wafer comprises an incomplete chip at an edge of the wafer, and the method further comprises attaching an additional dummy die to the incomplete chip.

8. The method of claim 7, wherein the additional dummy die is molded by the molding compound.

9. A method comprising:
   attaching a plurality of dummy dies to a plurality of chips of a wafer;
   molding the plurality of dummy dies in a molding compound;
   thinning the molding compound to expose the plurality of dummy dies; and
   sawing the wafer into a plurality of packages, with each of the plurality of packages comprising one of the plurality of dummy dies.

10. The method of claim 9, wherein the plurality of dummy dies comprises no integrated circuits therein.

11. The method of claim 9, wherein each of the plurality of dummy dies is attached to one of the plurality of chips through a plurality of die-attach films, and wherein the plurality of dummy dies is electrically insulated from the plurality of chips by the plurality of die-attach films.

12. The method of claim 9 further comprising attaching an additional dummy die to an incomplete chip at an edge of the wafer.

13. The method of claim 12, wherein during the molding the plurality of dummy dies, the additional dummy die is molded in the molding compound.

14. The method of claim 12, wherein no active die is bonded to the incomplete chip.

15. The method of claim 9 further comprising bonding a plurality of active dies to the plurality of chips, wherein in the molding the plurality of dummy dies, the plurality of active dies is molded by the molding compound, and wherein after the thinning the molding compound, the plurality of active dies is exposed.

16. A method comprising:
   attaching a first plurality of dummy dies to a plurality of chips of a wafer;
   bonding a plurality of active dies to the plurality of chips;
   attaching a second plurality of dummy dies to a plurality of incomplete chips of the wafer; and
   molding the first plurality of dummy dies, the second plurality of dummy dies, and the plurality of active dies in a molding compound, wherein no active die is bonded to the plurality of incomplete chips when the molding is performed.

17. The method of claim 16 further comprising performing a grinding to expose the plurality of active dies.

18. The method of claim 17, wherein after the grinding, the first plurality of dummy dies and the second plurality of dummy dies are exposed.

19. The method of claim 16, wherein the plurality of chips comprises:
  semiconductor substrates; and
  through-vias extending into respective ones of the semiconductor substrates, wherein the through-vias are electrically coupled to respective ones of the plurality of active dies, and no through-via in the wafer is electrically coupled to the first plurality of dummy dies and the second plurality of dummy dies.

20. The method of claim 16, wherein the first plurality of dummy dies and the second plurality of dummy dies are blank dies free from integrated circuits therein.

* * * * *